United States Patent [19]

Poucher et al.

[11] Patent Number: 5,389,811
[45] Date of Patent: Feb. 14, 1995

[54] FAULT-PROTECTED OVERVOLTAGE SWITCH EMPLOYING ISOLATED TRANSISTOR TUBS

[75] Inventors: Frank Poucher; John Quill, both of Limerick, Ireland

[73] Assignee: Analog Devices, Incorporated, Norwood, Mass.

[21] Appl. No.: 227,727

[22] Filed: Apr. 14, 1994

[51] Int. Cl.⁶ .................. H01L 27/02; H01L 29/06; H01L 29/78
[52] U.S. Cl. .................. 257/360; 257/357; 257/372; 257/374
[58] Field of Search ................ 257/355, 356, 357, 360, 257/361, 369, 372, 374

[56] References Cited

U.S. PATENT DOCUMENTS

| | | | |
|---|---|---|---|
| 3,947,727 | 3/1976 | Stewart | 257/360 |
| 4,739,437 | 4/1988 | Morgan | 257/360 |
| 5,162,888 | 11/1992 | Co et al. | 257/357 |

FOREIGN PATENT DOCUMENTS

| | | | |
|---|---|---|---|
| 57-130468 | 8/1982 | Japan | 257/360 |
| 62-51260 | 3/1987 | Japan | 257/360 |
| 62-156854 | 7/1987 | Japan | 257/357 |
| 3-1569 | 1/1991 | Japan | 257/355 |

*Primary Examiner*—Ngan V. Ngo
*Attorney, Agent, or Firm*—Parmelee Bollinger & Bramblett

[57] ABSTRACT

An integrated-circuit (IC) chip formed with a fault-protected switch comprising three MOS transistors in series. Each transistor is placed in a corresponding tub of the IC chip. Each of these tubs is electrically isolated from all other sections of the IC chip, so that the MOS transistors are isolated from one another and from the chip voltage supplies.

11 Claims, 4 Drawing Sheets

5,389,811

FAULT-PROTECTED OVERVOLTAGE SWITCH EMPLOYING ISOLATED TRANSISTOR TUBS

BACKGROUND OF THE INVENTION

1. Field of the Invention

This invention relates to integrated-circuit (IC) chips having semiconductive switches such as might be used in multiplexers to connect any one of a number of inputs to an output. More particularly, this invention relates to so-called fault-protected overvoltage switches.

2. Description of the Prior Art

Fault-protected overvoltage switches have been provided commercially for some time. Such switches typically are arranged to open automatically if an excessive voltage is applied to the switch input (or the output in some cases), thereby preventing the overvoltage from reaching and damaging a device to which the switch is connected. Commonly, such switches comprise a number of series-connected MOSFET transistors. For example, they may include an N-channel MOSFET, a P-channel MOSFET, and another N-channel MOSFET, in that order.

Although the available prior art devices function reasonably well, they have a number of disadvantages. One disadvantage is that the circuits used heretofore require ancillary elements including diodes and additional MOSFETs to prevent problems such as are caused by reverse currents to the voltage supplies of the part. These ancillary elements require extra die area, thus increasing the cost of manufacture. They also degrade the performance of the switch in certain respects. These and still other disadvantages of the prior art have made it desirable to provide an improved switch design to avoid or minimize the problems with the prior art designs.

SUMMARY OF THE INVENTION

In a preferred embodiment of the invention, to be described hereinbelow in detail, an integrated-circuit (IC) chip is formed with a fault-protected switch comprising three MOS transistors in series. Each transistor is placed in a corresponding tub of the IC chip. Each of these tubs is electrically isolated from all other sections of the IC chip, so that the MOS transistors are isolated from one another and from the chip voltage supplies. The tubs thus are independent of the supply voltages, and the MOSFETs will not break down to the supplies under overvoltage conditions. This isolation is particularly advantageous because it eliminates the need for ancillary diodes and associated MOS circuitry used in prior art switches.

Other objects, aspects and advantages of the invention will in part be pointed out in, and in part apparent from, the following description considered together with the accompanying drawings.

DETAILED DESCRIPTION OF A PREFERRED EMBODIMENT

Figure 1:
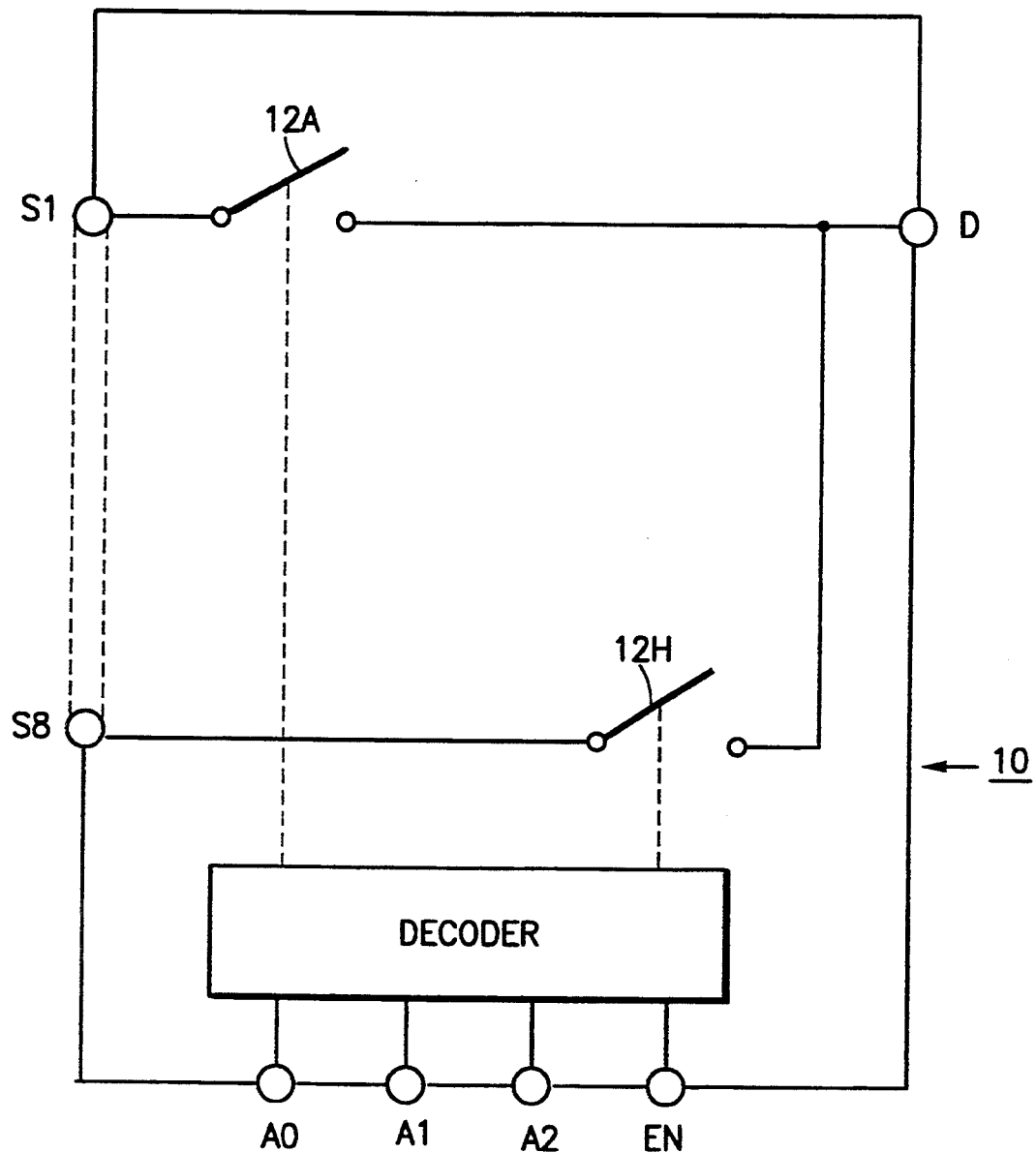
FIG. 1 is a block diagram illustration of a multiplexer known in the art.

Referring now to FIG. 1, there is shown in block diagram format a commercially available type of multiplexer 10 forming part of an IC chip. This device includes eight inputs S1–S8, each connected to one terminal of a corresponding switch 12A–12H. The other terminals of these switches are all connected together to a single output D. The switches are turned on or off (i.e., closed or opened) by conventional logic circuitry within the chip (not shown). This logic circuitry responds to digital code signal s applied to pins A0, A1, A2. An enable terminal EN is provided, and supply voltages are connected to the chip through terminals which are not shown. Only one switch is turned on at a time, as determined by the digital code signal.

Figure 2:
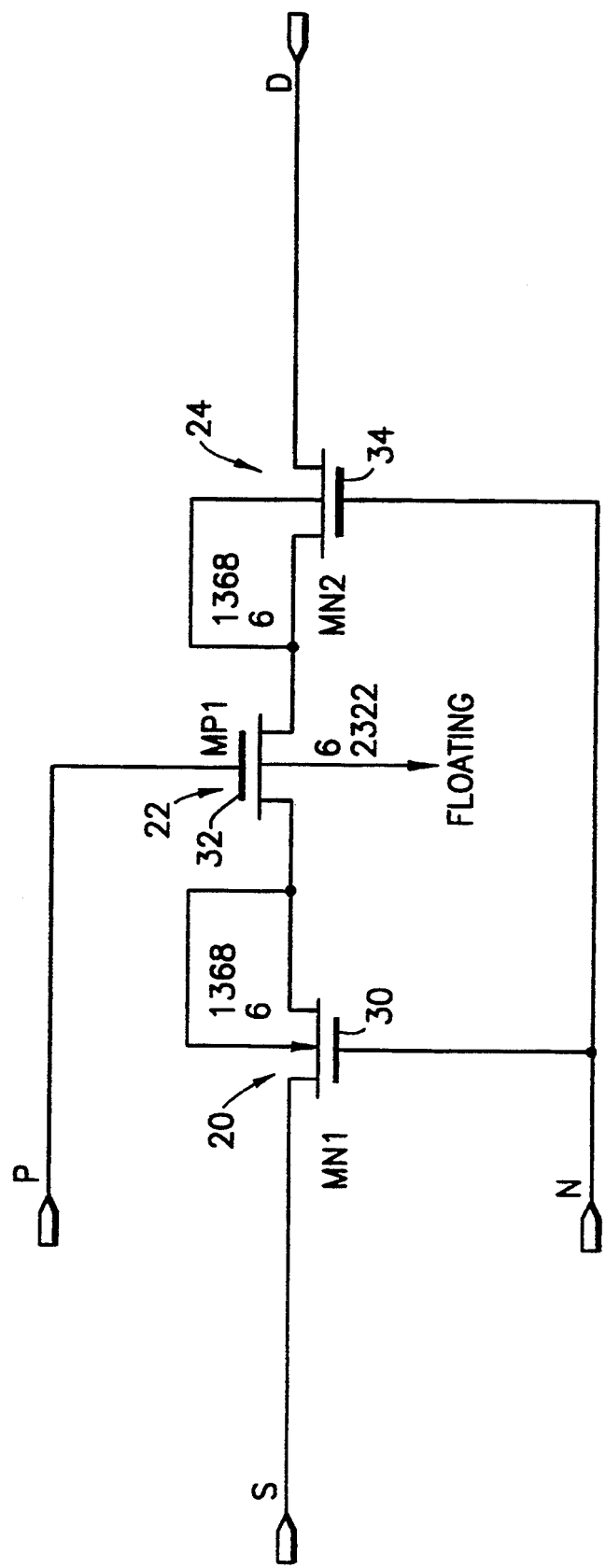
FIG. 2 is a circuit diagram of a switch in accordance with this invention.

FIG. 2 is a simplified circuit diagram of one of the switches 12A–12H. The switch includes three series-connected MOS transistors 20, 22 and 24. The first and third transistors are N-channel MOSFETs and the middle transistor is P-channel. The switch input terminal S is connected to the source electrode of the first N-channel MOS transistor 20. The drain electrode of this transistor is connected to the transistor backgate (or "bulk") and to the source electrode of the following P-channel MOSFET 22. The backgate of this transistor is floating, and its drain electrode is connected to the source electrode and backgate of the third transistor 24. The drain electrode of this transistor is in turn connected to the switch output terminal D.

The gate electrodes 30, 34 of the N-channel MOSFETs 20, 24 are connected together and to a control terminal N. The P-channel gate electrode 32 is connected to a second control terminal P. The control signals on these terminals N and P are determined by logic circuitry in the chip responding to an applied digital code. In effect the logic signals select one of the digital switches in the multiplexer 10 to be turned on.

In the embodiment described, these control signals N and P are either +15 volts or −15 volts, derived from the chip supply voltages. The control signals are complementary, such that when one is +15 volts, the other is −15 volts. When the N control signal is +15 volts, the N-channel transistors 20, 24 are turned on. The P terminal will at that time be −15 volts, and this voltage on the gate electrode 32 of the P-channel transistor 22 will turn that transistor on. Thus, all three transistors are turned on, and the switch is "closed", meaning that an input signal can be transmitted from the input S to the output D.

When the switch is "closed" the switch resistance $R_{ON}$ will not be zero, but it will be quite low (about 100 ohms for example). Thus signals can readily be transmitted with very little loss through the switch to a device such as an A/D converter connected to the output terminal D. When the P terminal is +15 volts and the N terminal is −15 volts, all three transistors 20, 22, 24 will be turned off, and the switch will open, that is, its resistance from the input terminal S to the output terminal D will be extremely high (typically megohms), effectively preventing signal transmission through the switch.

Figure 3:
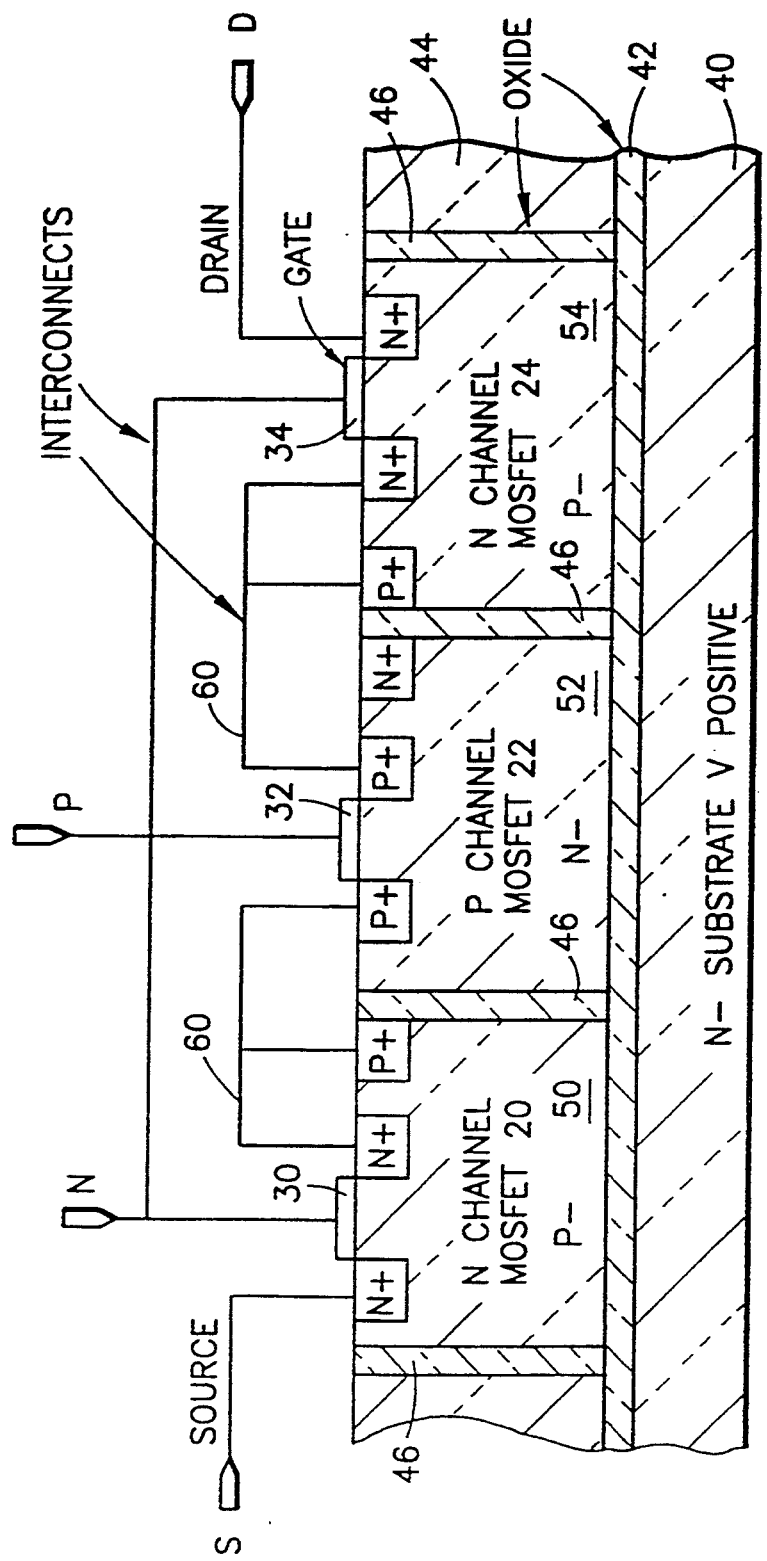
FIG. 3 is a section view sketch of an IC chip segment (not to scale) illustrating aspects of this invention.
Figure 4:
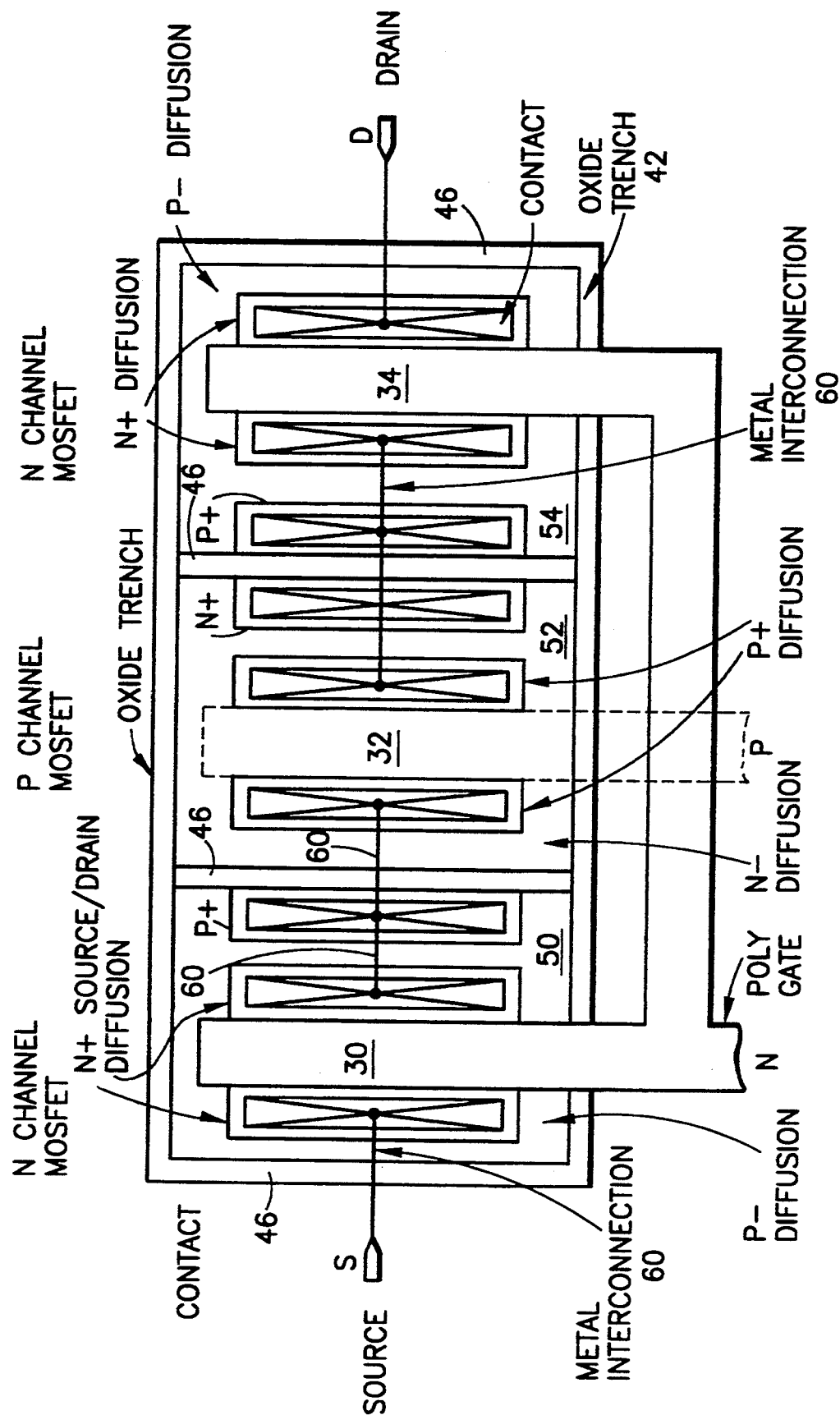
FIG. 4 is a plan view sketch of the IC chip segment shown in FIG. 3.

Turning now to FIGS. 3 and 4, it will be seen that the chip includes a silicon substrate 40 having an overlying layer 42 of oxide (silicon dioxide). A further layer 44 of silicon is formed over the oxide 42, and is etched to provide vertical trenches 46 extending down to the oxide 42. These trenches are filled with oxide, thereby defining electric-ally-isolated tubs 50, 52, 54 each having formed therein a respective one of the MOSFETs 20, 22, 24. Such isolation trenches can for example be formed by a process as described in patent application Ser. No. 08/192,162 filed Feb. 4, 1994 by K. Yallup et al, and assigned to the assignee of this application.

FIGS. 3 and 4 show the source, drain and gate electrodes for the three MOSFETs 20, 22, 24. The tubs 50, 52, 54 serve as the backgates for these transistors. The drawings also show conductive interconnects 60 connecting the three transistors in series. Interconnects also tie the drain electrode of MOSFET 20 to its backgate, and the source electrode of MOSFET 24 to its backgate. P+ implants are provided in the outer tubs 50, 54 for making connections to the N-channel backgates. The backgate of the center MOSFET 22 is left unconnected to any part of the circuitry, i.e., it is floating.

In operation, if the switch of FIG. 2 is closed, and an overvoltage with a magnitude approaching the voltage on the gate 30 (+15 volts) is applied to the input terminal S, the first MOSFET 20 will be turned off so as to prevent conduction through that transistor. That is, the switch will open, thereby to prevent the overvoltage from reaching the output terminal D and any devices connected to that terminal. It may be seen that the switch is symmetrical, so that if an overvoltage approaching +15 volts is applied to the output terminal D, that will shut down the other N-channel MOSFET 24 and thereby open the switch to prevent such overvoltage from reaching any device connected to the input terminal.

If the switch is closed and a negative overvoltage is applied to the input terminal S with a magnitude approaching the voltage on the gate 32 of the P-MOSFET 22 (−15 V), that transistor will be turned off so as to prevent conduction through the switch. That is, the switch will open. The same result will occur if the negative overvoltage is applied to the output terminal D of the switch. If the part loses power, the switch also will go open circuit.

The N-channel MOSFET backgates are tied to the respective source/drain electrodes of the P-channel MOSFET thus preventing either N-channel transistor from going into "snapback". Such snapback characteristic occurs when the collector/base junction avalanches under reverse bias and the resultant current flow through the P-type backgate resistance generates a voltage sufficient to turn on the lateral parasitic NPN bipolar transistor inherent in the N-channel MOSFET. As noted above, the P-channel backgate is left floating. With this arrangement of MOSFETs, all of the backgates are independent of the voltage supplies, so that the MOSFETs will not breakdown to the supplies under overvoltage conditions. This arrangement eliminates the need for isolation diodes and MOSFETs to the supplies, with attendant advantages including saving on die area.

The number of MOSFETs connected in series will determine the source-to-drain breakdown of the switch, with the breakdown of each individual transistor being determined by wafer fabrication process and device layout. The level of voltage at breakdown is determined either by the source-to-drain breakdown (i.e., the number of devices), or by source-to-supply breakdown which is determined by process oxide breakdown voltage. Thus the level of protection can be set by the number of devices in series with a limit at the process oxide breakdown voltage.

Since the backgate of the N-channel MOSFET is not hardwired to the negative supply, the backgate effect on the threshold voltage is reduced and thus the ON resistance of the N-channel is reduced, providing an overall lower $R_{ON}$ for the switch. The electrical isolation of the transistor tubs also provides latchup immunity and off-channel isolation (i.e., for the non-selected switches). It thus allows switches of a multiplexer to be placed closer together, giving a significant reduction in die area.

Avoidance of any devices such as diodes between the substrate and the voltage supplies improves the drive capability so as to increase the speed at which the part operates. The combination of reducing the N-channel thresholds, via the backgate connections, and the avoidance of any diodes between the substrate and the voltage supplies results in an improved signal range of operation for the switch. The switch can be used as an individual switch or in a group of switches, as in a multiplexer, providing a significant reduction in die area.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An integrated-circuit (IC) chip formed with a switch for use in applications where overvoltage conditions can cause damage to a device to which the switch is connected; said switch having input and output terminals; said IC chip comprising:

semiconductive material formed with a plurality of MOS transistors connected in series between the switch input and output terminals;

said transistors including at least one N-channel transistor and at least one P-channel transistor;

control terminal means;

means responsive to control signals applied to said control terminal means for turning off and on said transistors of said switch to open and close the circuit through such transistors;

means operable, when said switch transistors are in "on" state and an overvoltage is applied to said input terminal, for turning off at least one of said transistors when the applied voltage reaches a predetermined overvoltage level; and isolation means forming part of said IC chip to establish a plurality of isolation tubs each for at least a corresponding one of said transistors.

2. An IC chip as claimed in claim 1, including means responsive to a predetermined overvoltage applied to said output terminal for turning off at least one of said transistors.

3. An IC chip as claimed in claim 1, wherein said predetermined overvoltage bears a prefixed relationship to a supply voltage for said chip.

4. An IC chip as claimed in claim 1, wherein said switch transistors are symmetrically arranged such that the sequence and arrangement of the transistors is the same whether going from the input terminal to the output terminal or vice versa.

5. An IC chip as claimed in claim 1, wherein said IC chip is formed with isolation tubs for all of said transistors respectively.

6. An IC chip as claimed in claim 1, wherein said chip is of multi-layer construction, with a substrate, a layer of oxide, and a layer of semiconductive material having an upper surface remote from said oxide layer, in that order;

said layer of semiconductive material being formed with trenches extending from the upper surface of the layer down to said oxide layer;

said trenches being filled with oxide and serving to form said isolation tubs for respective MOSFETS.

7. An IC chip as claimed in claim 1, wherein said transistors have source and drain electrodes and a backgate, and at least certain of said transistors are provided with means connecting the backgate to a source or drain electrode of the transistor.

8. An IC chip as claimed in claim 7, wherein an N-channel MOSFET has a connection between its backgate and one of said electrodes of an adjacent P-channel transistor in series therewith.

9. An IC chip as claimed in claim 8, wherein said N and P channel transistors are arranged in alternating sequence, with two N-channel transistors being connected respectively to the source and drain electrodes of a P-channel transistor between the two N-channel transistors.

10. An IC chip as claimed in claim 9, wherein each of said N-channel transistors is provided with a connection between its backgate and the source and drain electrodes respectively of the P-channel transistor therebetween.

11. An IC chip as claimed in claim 1, wherein said P-channel MOSFET has a backgate and it is floating.

* * * * *